(12) United States Patent
Miwa et al.

(10) Patent No.: US 9,203,357 B2
(45) Date of Patent: Dec. 1, 2015

(54) POWER AMPLIFIER

(75) Inventors: Shinichi Miwa, Tokyo (JP); Yoshihiro Tsukahara, Tokyo (JP); Ko Kanaya, Tokyo (JP); Naoki Kosaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 13/433,410

(22) Filed: Mar. 29, 2012

(65) Prior Publication Data

US 2013/0032817 A1 Feb. 7, 2013

(30) Foreign Application Priority Data

Aug. 4, 2011 (JP) .................................. 2011-170860

(51) Int. Cl.
*H01L 27/085* (2006.01)
*H01L 23/66* (2006.01)
(Continued)

(52) U.S. Cl.
CPC ............... *H03F 1/56* (2013.01); *H01L 23/647* (2013.01); *H01L 23/66* (2013.01); *H01L 27/0207* (2013.01); *H01L 27/0605* (2013.01); *H01L 27/085* (2013.01); *H03F 3/195* (2013.01); *H03F 3/211* (2013.01); *H03F 3/245* (2013.01); *H01L 21/8252* (2013.01); *H01L 2223/6655* (2013.01);
(Continued)

(58) Field of Classification Search
CPC ......... H01L 27/06; H01L 31/12; H01L 31/14; H01L 23/647; H01L 27/0207; H01L 27/085; H01L 27/0605; H01L 23/66; H03F 3/04; H03F 3/06; H03F 3/191; H03F 3/68

USPC ........... 257/76, 330, 159, 234, 239, 907, 318; 330/250, 68, 296, 126, 295, 307, 286, 330/311, 302, 53
See application file for complete search history.

(56) References Cited

U.S. PATENT DOCUMENTS 6,486,752 B1 * 11/2002 Noguchi ........................ 333/195
7,030,698 B2 * 4/2006 Goto et al. ..................... 330/295
(Continued)

FOREIGN PATENT DOCUMENTS

| CN | 101170300 A | 4/2008 |
|---|---|---|
| JP | 2-206158 A | 8/1990 |

(Continued)

OTHER PUBLICATIONS

Japanese Patent Office; Office Action in Japanese Patent Application No. 2011-170860 (Aug. 18, 2015).
(Continued)

*Primary Examiner* — Evan Pert
*Assistant Examiner* — Damon Hillman
(74) *Attorney, Agent, or Firm* — Leydig, Voit & Mayer, Ltd.

(57) ABSTRACT

A power amplifier includes a semiconductor substrate including transistor cells, a drain electrode for the transistor cells located on the semiconductor substrate, a drain pad located on the semiconductor substrate and connected to the drain electrode, an ion-implanted resistance located in the semiconductor substrate and extending along and in contact with the drain pad, a floating electrode located on the semiconductor substrate and in contact with the ion-implanted resistance, and an output matching circuit located outside the semiconductor substrate. The power amplifier further includes a wire connecting the drain pad to the output matching circuit.

16 Claims, 6 Drawing Sheets

(51) Int. Cl.

| | | |
|---|---|---|
| H03F 1/56 | (2006.01) | |
| H01L 27/02 | (2006.01) | |
| H01L 27/06 | (2006.01) | |
| H03F 3/195 | (2006.01) | |
| H03F 3/21 | (2006.01) | |
| H03F 3/24 | (2006.01) | |
| H01L 23/64 | (2006.01) | |
| H01L 21/8252 | (2006.01) | |

(52) U.S. Cl.
CPC .............. *H01L 2224/48137* (2013.01); *H01L 2224/49175* (2013.01); *H01L 2924/00014* (2013.01); *H01L 2924/1305* (2013.01); *H03F 2200/222* (2013.01); *H03F 2200/387* (2013.01); *H03F 2203/21106* (2013.01); *H03F 2203/21142* (2013.01)

(56) References Cited

U.S. PATENT DOCUMENTS

| | | | |
|---|---|---|---|
| 7,777,571 B2 * | 8/2010 | Gotou et al. ............... 330/295 | |
| 2004/0222854 A1 | 11/2004 | Goto et al. | |
| 2007/0046379 A1 * | 3/2007 | Tanahashi et al. ......... 330/311 | |
| 2007/0171000 A1 * | 7/2007 | Tsukahara ................. 333/33 | |
| 2008/0094141 A1 | 4/2008 | Gotou et al. | |
| 2010/0246153 A1 | 9/2010 | Buer | |
| 2012/0049952 A1 * | 3/2012 | Ng ............................. 330/126 | |
| 2012/0133436 A1 * | 5/2012 | Tsukahara ................. 330/253 | |

FOREIGN PATENT DOCUMENTS

| | | |
|---|---|---|
| JP | 4-129408 A | 4/1992 |
| JP | 2001-148616 A | 5/2001 |
| JP | 2001-185966 A | 7/2001 |
| JP | 2004-336445 A | 11/2004 |
| JP | 2010-56132 A | 3/2010 |
| TW | 201044588 A1 | 12/2010 |

OTHER PUBLICATIONS

State Intellectual Property Office of the People's Republic of China; Office Action in Chinese Patent Application No. 201210274868.1 (Dec. 31, 2014).

Struble, W., et al.; "A Rigorous Yet Simple Method for Determining Stability of Linear N-Port Networks", *IEEE GaAs IC Symposium*, (1993), pp. 251-254.

Mons, S. et al.; "A Unified Approach for the Linear and Nonlinear Stability Analysis of Microwave Circuits Using Commercially Available Tools", *IEEE Transactions on Microwave Theory and Techniques*, vol. 47, No. 12, (Dec. 1999), pp. 2403-2409.

Taiwan Patent Office; Office Action in Taiwanese Patent Application No. 101110508 (Feb. 25, 2014).

Japanese Patent Office; Office Action in corresponding Japanese Patent Application No. 2011-170860 (May 12, 2015).

\* cited by examiner

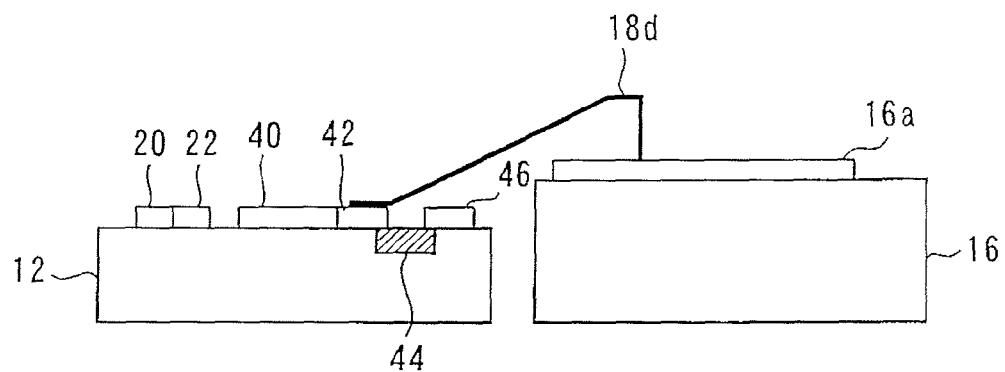
FIG. 3
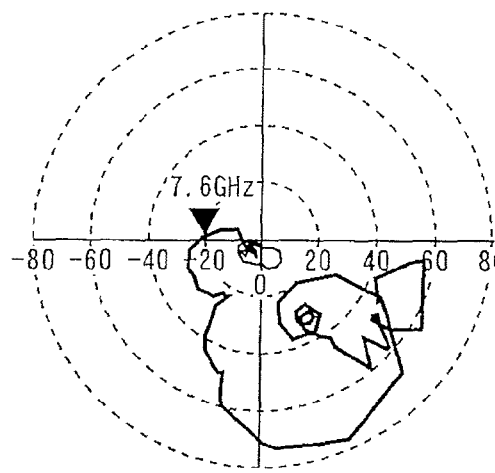 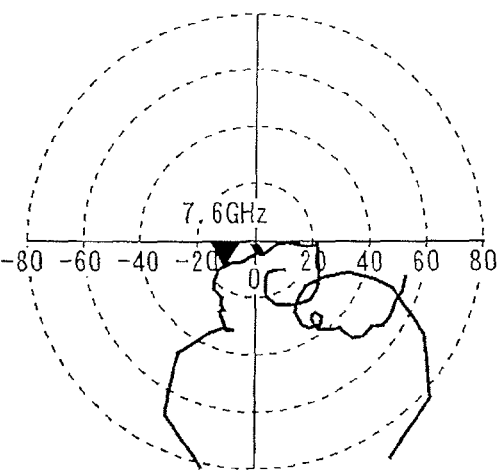
FIG. 4A              FIG. 4B

POWER AMPLIFIER

BACKGROUND OF THE INVENTION

1. Field of the Invention

The present invention relates to a power amplifier for amplifying high frequency signals, etc. used, e.g., in mobile communications.

2. Background Art

Japanese Laid-Open Patent Publication No. 2001-148616 discloses a power amplifier that includes a chip having a plurality of field effect transistors (FETs). Resistive elements are formed in the chip and across the closed loops formed on the chip, in order to prevent loop oscillation on the chip. These resistive elements are resistances formed from an epitaxial layer. (Such resistances are hereinafter referred to as epi resistances.)

In order to prevent loop oscillation by absorbing its oscillation power, it is desirable that the resistive elements described above have a resistance value of approximately a few to a few tens of ohms. In the case of the power amplifier disclosed in the above publication, however, it has been found difficult to control the resistance values of these resistive elements, since they are epi resistances.

SUMMARY OF THE INVENTION

The present invention has been made to solve the foregoing problem. It is, therefore, an object of the present invention to provide a power amplifier in which it is possible to easily control the values of resistances for absorbing the power of loop oscillation.

The features and advantages of the present invention may be summarized as follows.

A power amplifier includes a semiconductor substrate in which a plurality of transistor cells are formed, a drain electrode for the plurality of transistor cells which is formed on the semiconductor substrate, a drain pad formed on the semiconductor substrate and connected to the drain electrode, an ion-implanted resistance formed in the semiconductor substrate and extending along and in contact with the drain pad, a floating electrode formed on the semiconductor substrate and in contact with the ion-implanted resistance, an output matching circuit formed outside the semiconductor substrate, and a wire connecting the drain pad to the output matching circuit.

Other and further objects, features and advantages of the invention will appear more fully from the following description.

BRIEF DESCRIPTION OF THE DRAWINGS

FIG. 3 is a cross-sectional view taken along dashed line III-III of FIG. 2 and viewed in the direction of the arrows;

FIG. 4 (which includes FIGS. 4A and 4B) shows results of simulations for determining based on the Nyquist criterion whether loop oscillation occurs;

DETAILED DESCRIPTION OF THE PREFERRED EMBODIMENTS

First Embodiment

Figure 1:
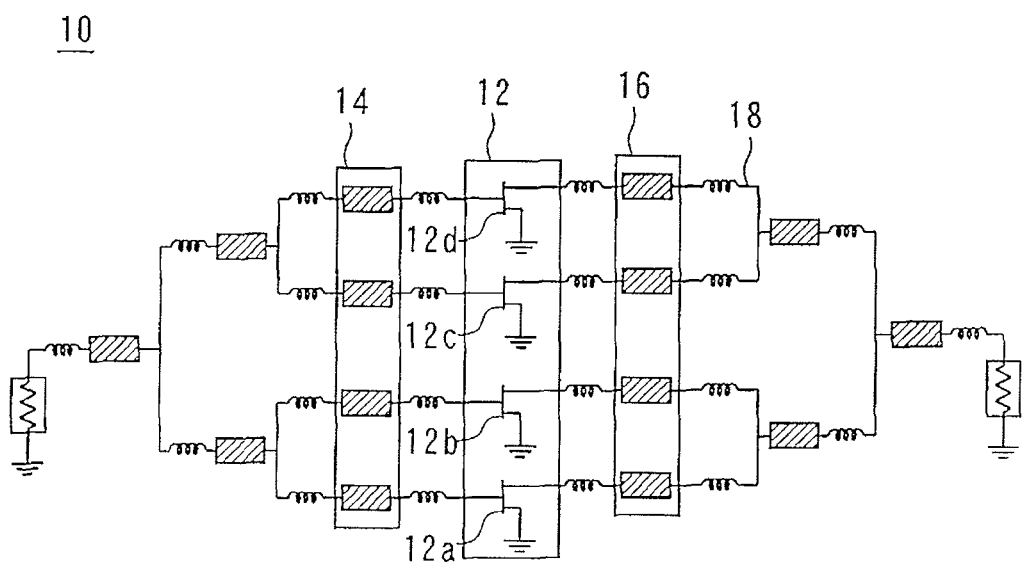
FIG. 1 is a circuit diagram of a power amplifier in accordance with a first embodiment of the present invention.

FIG. 1 is a circuit diagram of a power amplifier 10 in accordance with a first embodiment of the present invention. The power amplifier 10 includes a semiconductor substrate 12. The semiconductor substrate 12 is a chip of GaN. A plurality of transistor cells are formed in the semiconductor substrate 12. These transistor cells are a first transistor cell 12a, a second transistor cell 12b disposed adjacent the first transistor cell 12a, a third transistor cell 12c disposed adjacent the second transistor cell 12b, and a fourth transistor cell 12d disposed adjacent the third transistor cell 12c. The transistor cells 12a, 12b, 12c, and 12d are field effect transistors (FETs). The transistor cells 12a, 12b, 12c, and 12d are connected in parallel between the input and output of the power amplifier 10 so that the power amplifier exhibits high output power while maintaining the desired high frequency characteristics.

An input matching circuit 14 is connected to the gates of the transistor cells 12a, 12b, 12c, and 12d. The input matching circuit 14 is formed outside the semiconductor substrate 12. An output matching circuit 16 is connected to the drains of the transistor cells 12a, 12b, 12c, and 12d. The output matching circuit 16 is formed outside the semiconductor substrate 12.

Figure 2:
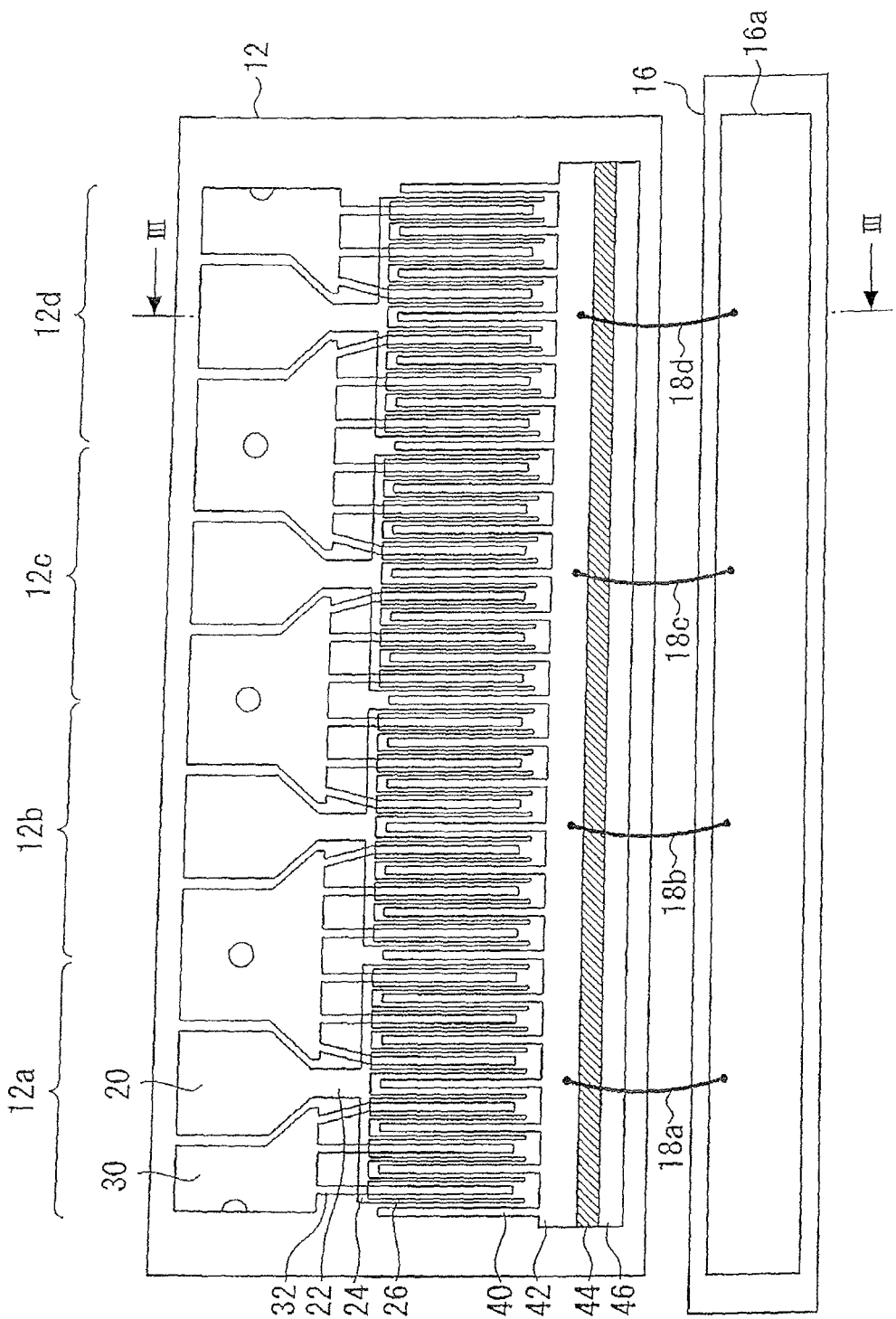
FIG. 2 is a plan view showing the semiconductor substrate and the output matching circuit of the first embodiment.

FIG. 2 is a plan view showing the semiconductor substrate and the output matching circuit of the first embodiment. For each transistor cell, a gate RF pad 20 is formed on the semiconductor substrate 12. The gate RF pad 20 is connected to a gate lead-out electrode 22. The gate lead-out electrode 22 is connected to a gate feed portion 24. The gate feed portion 24 has comb-tooth-like gate fingers 26 formed thereto.

Source pads 30 are formed on the semiconductor substrate 12, and each gate RF pad 20 is sandwiched between adjacent source pads 30. Comb-tooth-like source electrodes 32 are connected to each source pad 30. The drain electrodes 40 of the transistor cells 12a, 12b, 12c, and 12d are formed on the semiconductor substrate 12. The drain electrodes 40 have a comb-tooth-like configuration. The drain electrodes 40, the gate fingers 26, and the source electrodes 32 constitute the electrodes of the transistor cells. A drain pad 42 is formed on the semiconductor substrate 12 and connected to the drain electrodes 40. The drain pad 42 is formed to have an elongated configuration having a longitudinal direction and a transverse direction. The drain electrodes 40 are arranged in the longitudinal direction of the drain pad 42 and are connected thereto. That is, all of the drain electrodes 40 of the transistor cells 12a, 12b, 12c, and 12d are connected to the common drain pad 42.

An ion-implanted resistance 44 is formed in the semiconductor substrate 12 and extends along and in contact with a longitudinal side of the drain pad 42. The ion-implanted resistance 44 is formed by implanting the semiconductor substrate 12 with impurity ions and then heat treating the substrate. As a result of the formation of this ion-implanted resistance 44, a resistance of approximately a few to a few tens of ohms is connected in parallel to, or across, each of the closed loops which are formed on the semiconductor substrate 12 and in which loop oscillation might occur.

A floating electrode 46 is formed on the semiconductor substrate 12 and in contact with the ion-implanted resistance 44, which is in contact with the drain pad 42. That is, the ion-implanted resistance 44 is sandwiched along its length between the drain pad 42 and the floating electrode 46.

The output matching circuit 16 is provided with a pad 16a. The drain pad 42 and the pad 16a are connected to each other by bonding wires 18a, 18b, 18c, and 18d. FIG. 3 is a cross-sectional view taken along dashed line III-III of FIG. 2 and viewed in the direction of the arrows. FIG. 3 shows how the ion-implanted resistance 44 formed in the semiconductor substrate 12 is in contact with the drain pad 42. The power amplifier of the first embodiment is provided with the components described above.

The more transistor cells formed on the semiconductor substrate 12, the more closed loops formed by adjacent transistor cells, and the more likely it is that loop oscillation occurs. However, in the power amplifier 10 of the first embodiment, the ion-implanted resistance 44 is formed across the closed loops which are formed on the semiconductor substrate 12 and in which loop oscillation might occur. Therefore, the ion-implanted resistance 44 serves to interconnect the transistor cells, thereby preventing all modes of loop oscillation on the semiconductor substrate 12. It should be noted that a resistance formed between transistor cells is at times referred to as an isolation resistance.

Further, the resistance value of the ion-implanted resistance 44 can be easily controlled by changing the quantity of ions implanted and the ion implantation energy, making it possible to easily provide approximately a few to a few tens of ohms of resistance for preventing loop oscillation. Even if the semiconductor substrate 12 is made of a material having a high epi sheet resistance, such as GaN, it is possible to easily form a resistance of approximately a few to a few tens of ohms. Further, the presence of the ion-implanted resistance 44 does not affect the characteristics of the power amplifier 10 such as gain and output power, since the bonding wires 18a, 18b, 18c, and 18d connected between the drain pad 42 and the pad 16a extend above the ion-implanted resistance 44.

FIG. 4 (which includes FIGS. 4A and 4B) shows results of simulations for determining based on the Nyquist criterion whether loop oscillation occurs. The Nyquist criterion is a method of determining whether oscillation occurs in a closed loop including, e.g., a transistor, by plotting on a polar chart the loop gain of the transistor with respect to frequency and determining whether the resulting locus crosses the negative real axis. Detailed explanation of the Nyquist criterion is disclosed in the non-patent document 1 (W. Struble and A. Plazker, "A Rigorous Yet Simple Method For Determining Stability of Linear N-port Networks," IEEE CaArICSymp. Dig., pp. 251-254, 1993) and non-patent document 2 (S. Mons, "A Unified Approach for Linear and Nonlinear Stability Analysis of Microwave Circuit Using Commercially Available Tools," IEEE Trans. Microwave Theory and Tech. vol. MTT-47, no. 12, pp. 2403-2409, 1999).

FIG. 4A shows a simulation result of the loop gain of a power amplifier which is similar to that of the first embodiment but without the ion-implanted resistance 44. In this case, the loop gain locus crosses the negative real axis at about 7.6 GHz, meaning that oscillation occurs in this power amplifier under some particular conditions.

FIG. 4B shows a simulation result of the loop gain of the power amplifier of the first embodiment, which is provided with the ion-implanted resistance 44. In this case, the loop gain locus does not cross the negative real axis at any frequency. This results from the fact that the ion-implanted resistance 44 absorbs the power of loop oscillation. It should be noted that these simulations were conducted on semiconductor substrates in which 32 transistor cells are formed in parallel relationship to each other.

Although in the first embodiment the transistor cells of the power amplifier 10 are FETs, it is to be understood that they may be other types of transistors such as, e.g., bipolar transistors. Further, although in the first embodiment the semiconductor substrate 12 is formed of GaN, it is to be understood that it may be formed of other material such as, e.g., GaAs. The bonding wires 18a, 18b, 18c, and 18d may be replaced by any other suitable type of electrical connection wire.

Second Embodiment

Figure 5:
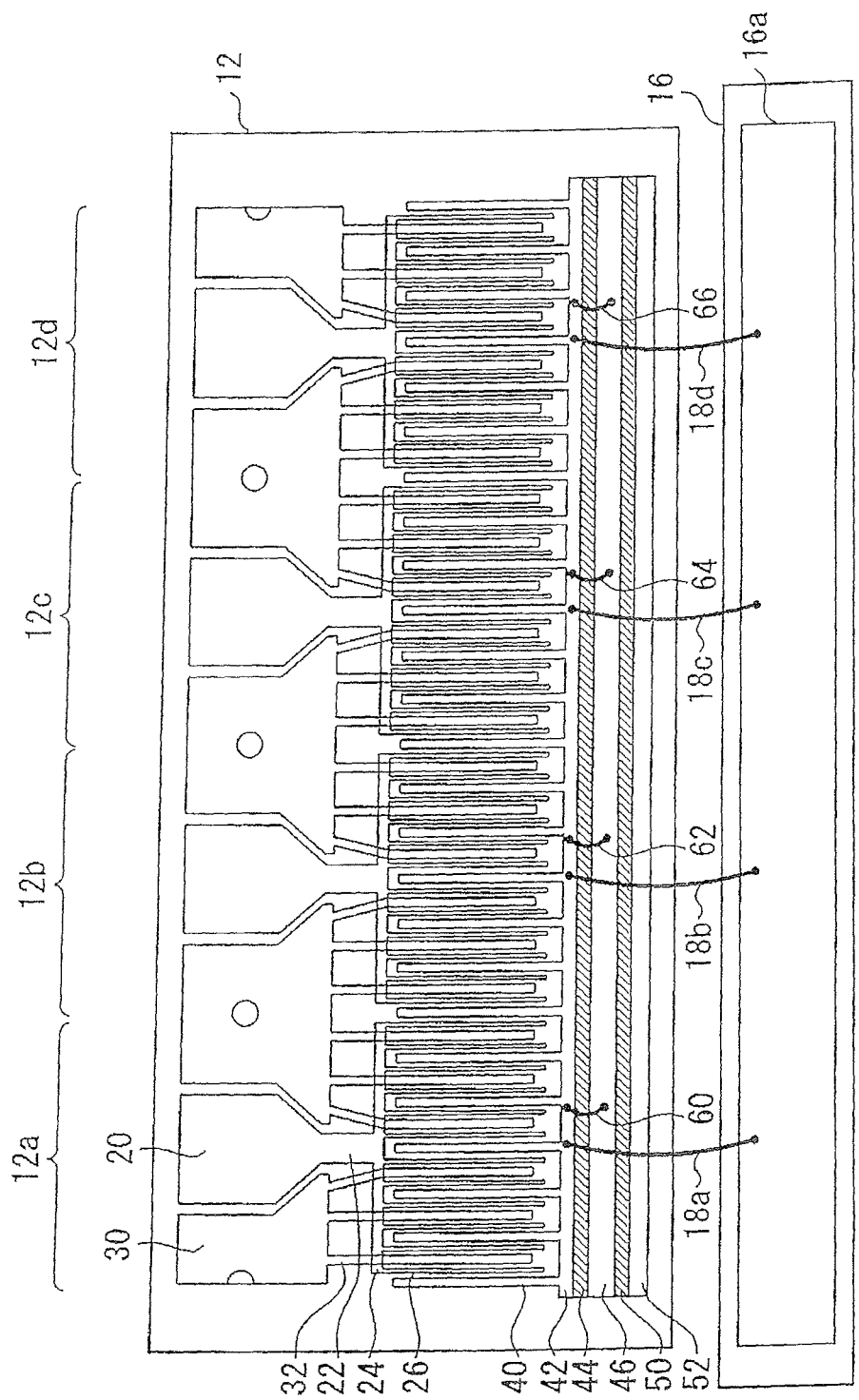
FIG. 5 is a plan view showing the semiconductor substrate and the output matching circuit of the power amplifier of the second embodiment.

A power amplifier in accordance with a second embodiment of the present invention has many features common to the power amplifier of the first embodiment. Therefore, the following description of the power amplifier of the second embodiment will be primarily directed to the differences from the power amplifier of the first embodiment. FIG. 5 is a plan view showing the semiconductor substrate 12 and the output matching circuit 16 of the power amplifier of the second embodiment.

An additional ion-implanted resistance 50 is formed in the semiconductor substrate 12 and in contact with the floating electrode 46, which is in contact with the ion-implanted resistance 44. The additional ion-implanted resistance 50 is formed by implanting the semiconductor substrate 12 with impurity ions and then heat treating the substrate.

An additional floating electrode 52 is formed on the semiconductor substrate 12 and in contact with the additional ion-implanted resistance 50, which is in contact with the floating electrode 46. Further, the drain pad 42 and the floating electrode 46 are connected to each other by way of bonding wires 60, 62, 64, and 66.

In the case of the power amplifier of the first embodiment, only the ion-implanted resistance 44 is formed across the closed loops formed on the semiconductor substrate. This means that the value of resistance appearing across each closed loop cannot be changed after the ion-implanted resistance 44 is formed. In the case of the power amplifier of the second embodiment, on the other hand, the additional ion-implanted resistance 50, in addition to the ion-implanted resistance 44, is formed across the closed loops. With this arrangement, the drain pad 42 and the floating electrode 46, which is in contact with the additional ion-implanted resistance 50, may or may not be connected to each other by the bonding wires 60, 62, 64, and 66. This means that the resistance appearing across each closed loop on the semiconductor substrate can be set to either one of two different values. It should be noted that the power amplifier of the second embodiment is susceptible of at least alterations similar to those that can be made to the power amplifier of the first embodiment.

Third Embodiment

Figure 6:
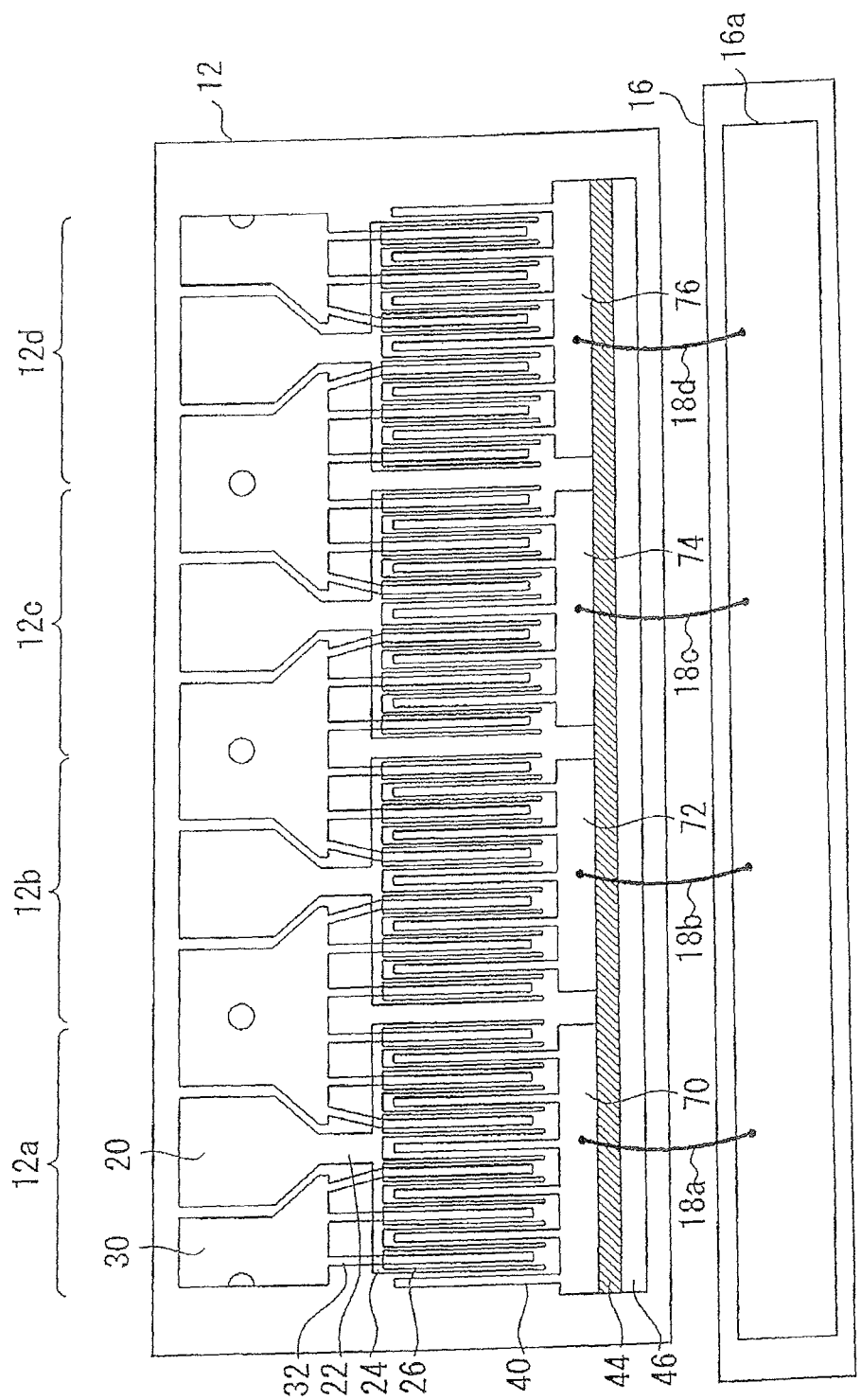
FIG. 6 is a plan view showing the semiconductor substrate and the output matching circuit of the power amplifier of the third embodiment.

A power amplifier in accordance with a third embodiment of the present invention has many features common to the power amplifier of the first embodiment. Therefore, the following description of the power amplifier of the third embodiment will be primarily directed to the differences from the power amplifier of the first embodiment. FIG. 6 is a plan view showing the semiconductor substrate and the output matching circuit of the power amplifier of the third embodiment.

The power amplifier of the third embodiment is characterized by including a separate drain pad for each transistor cell.

Specifically, the power amplifier of the third embodiment includes a first drain pad 70. The first drain pad 70 is the drain pad of the first transistor cell 12a. A second drain pad 72 is formed adjacent but spaced from the first drain pad 70. The second drain pad 72 is the drain pad of the second transistor cell 12b. A third drain pad 74 is formed adjacent the second drain pad 72 but spaced from the first and second drain pads 70 and 72. The third drain pad 74 is the drain pad of the third transistor cell 12c. A fourth drain pad 76 is formed adjacent the third drain pad 74 but spaced from the first to third drain pads 70, 72, and 74. The fourth drain pad 76 is the drain pad of the fourth transistor cell 12d.

The first to fourth drain pads 70, 72, 74, and 76 are connected together only by way of the ion-implanted resistance 44. For example, the first drain pad 70 is not in direct contact with the second drain pad 72, but is connected to the second drain pad 72 by the ion-implanted resistance 44.

Thus in the power amplifier of the third embodiment, the first to fourth drain pads 70, 72, 74, and 76 are connected together only by way of the ion-implanted resistance 44. This is equivalent to saying that a resistance is connected between each two of these drain pads, which form closed loops in which loop oscillation might occur. That is, the ion-implanted resistance 44 functions as an isolation resistance for suppressing loop oscillation. Although in the power amplifier of the third embodiment a separate drain pad is provided for each transistor cell, it is to be understood that in other embodiments a drain pad may be provided for each two or more transistor cells. It should be noted that the power amplifier of the third embodiment is susceptible of at least alterations similar to those that can be made to the power amplifier of the first embodiment.

Fourth Embodiment

Figure 7:
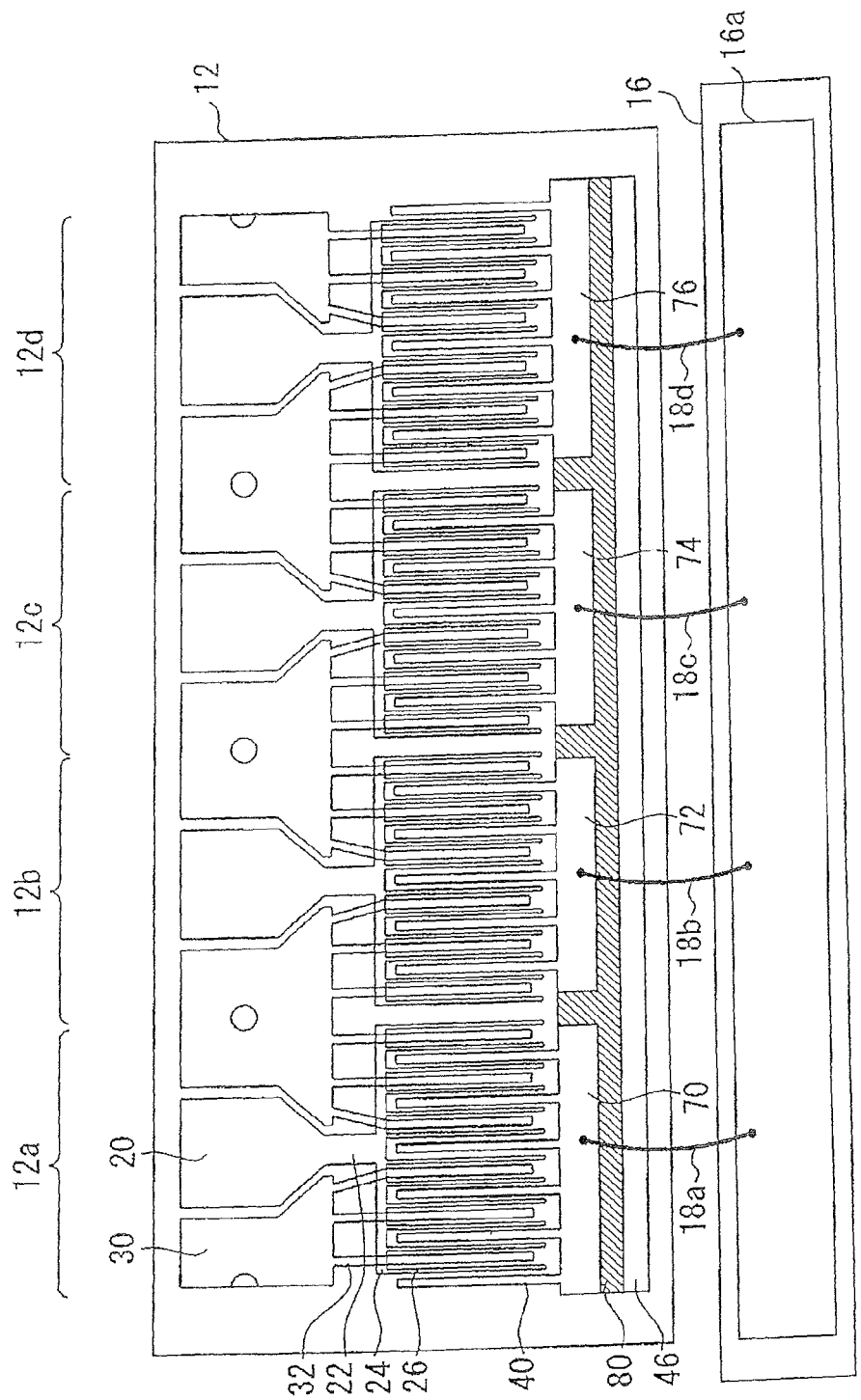
FIG. 7 is a plan view showing the semiconductor substrate and the output matching circuit of the power amplifier of the fourth embodiment.

A power amplifier in accordance with a fourth embodiment of the present invention has many features common to the power amplifier of the third embodiment. Therefore, the following description of the power amplifier of the fourth embodiment will be primarily directed to the differences from the power amplifier of the third embodiment. FIG. 7 is a plan view showing the semiconductor substrate and the output matching circuit of the power amplifier of the fourth embodiment.

The power amplifier of the fourth embodiment is characterized in that the ion-implanted resistance 80 thereof extends between the first drain pad 70 and the second drain pad 72, between the second drain pad 72 and the third drain pad 74, and between the third drain pad 74 and the fourth drain pad 76, as well as extending along the lengths of these drain pads.

In the power amplifier of the fourth embodiment, since the ion-implanted resistance 80 extends between drain pads, the control of the values of resistance between these drain pads is facilitated. Further, it is possible to easily control the values of resistance between the drain pads by changing the spacing between adjacent drain pads. It should be noted that the power amplifier of the fourth embodiment is susceptible of at least alterations similar to those that can be made to the power amplifier of the first embodiment.

In accordance with the present invention, there is provided a power amplifier in which an ion-implanted resistance is connected to closed loops so as to absorb the power of loop oscillation, wherein the resistance value of the ion-implanted resistance can be easily controlled to suppress the oscillation.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-170860, filed on Aug. 4, 2011 including specification, claims, drawings, and summary, on which the Convention priority of the present application is based, is incorporated herein by reference in its entirety.

What is claimed is:

1. A power amplifier comprising:
   a semiconductor substrate comprising a plurality of transistor cells;
   a drain electrode of said plurality of transistor cells located on said semiconductor substrate;
   a drain pad located on said semiconductor substrate and connected to said drain electrode;
   a first ion-implanted resistance located in said semiconductor substrate and extending along and in contact with said drain pad;
   a first floating electrode located on said semiconductor substrate and in contact with said first ion-implanted resistance;
   an output matching circuit located outside said semiconductor substrate; and
   a wire connecting said drain pad to said output matching circuit.

2. The power amplifier according to claim 1, further comprising:
   a second ion-implanted resistance located in said semiconductor substrate and in contact with said first floating electrode; and
   a second floating electrode located on said semiconductor substrate and in contact with said second ion-implanted resistance.

3. The power amplifier according to claim 1, wherein:
   said plurality of transistor cells includes a first transistor cell, and a second transistor cell disposed adjacent said first transistor cell;
   said drain pad includes a first drain pad of said first transistor cell and a second drain pad of said second transistor cell, said second drain pad being separate from said first drain pad; and
   said first drain pad is connected to said second drain pad by said first ion-implanted resistance.

4. The power amplifier according to claim 3, wherein said first ion-implanted resistance further extends between said first drain pad and said second drain pad.

5. The power amplifier according to claim 1, wherein said semiconductor substrate is GaN.

6. The power amplified according to claim 1, wherein said first ion-implanted resistance has in a range from a few ohms to a few tens of ohms.

7. A power amplifier comprising:
   a semiconductor substrate;
   a plurality of transistor cells on and in said semiconductor substrate, side-by-side along a longitudinal direction on said semiconductor substrate and electrically connected in parallel, wherein
   each transistor cell includes a drain pad electrically connected to drain electrodes of said cell, and
   said drain pads of said transistor cells extend along the longitudinal direction and are electrically connected to each other;
   a first ion-implanted resistance located in said semiconductor substrate and extending along the longitudinal direction and in contact with said drain pads of staid transistor cells, interconnecting said transistor cells and preventing loop oscillation in said power amplifier;

a first floating electrode located on said semiconductor substrate, extending in the longitudinal direction, and in contact with said first ion-implanted resistance, wherein said first ion-implanted resistance is sandwiched by said first floating electrode and said drain pads of said transistor cells;

an output matching circuit located outside said semiconductor substrate; and wires connecting said drain pads to said output matching circuit.

8. The power amplifier according to claim 7 wherein said drain pads of said transistor cells comprise a single continuous drain pad.

9. The power amplified according to claim 7, wherein said first ion-implanted resistance has in a range from a few ohms to a few tens of ohms.

10. The power amplifier according to claim 7, comprising:
a second ion-implanted resistance located in said semiconductor substrate, extending along the longitudinal direction, and in contact with said first floating electrode; and
a second floating electrode located on said semiconductor substrate, extending in the longitudinal direction, and in contact with said second ion-implanted resistance, wherein said second ion-implanted resistance is sandwiched by said first and second floating electrodes.

11. The power amplifier according to claim 10 comprising wires connecting said drain pads of said transistor cells to said first ion-implanted resistance.

12. The power amplifier according to claim 10 wherein said drain pads of said transistor cells comprise a single continuous drain pad.

13. The power amplifier according to claim 7, wherein said drain pads of said transistor cells are not continuous between adjacent transistor cells and said first ion-implanted resistance extends beside and between said drain pads, electrically connecting said drain pads of said transistor cells together.

14. The power amplifier according to claim 7, wherein said drain pads of said transistor cells are not continuous between adjacent transistor cells and said first ion-implanted resistance extends beside but not between said drain pads, electrically connecting said drain pads of said transistor cells together.

15. The power amplifier according to claim 1, wherein said first ion-implanted resistance is sandwiched by said first floating electrode and said drain pad.

16. The power amplifier according to claim 2, wherein:
said first ion-implanted resistance is sandwiched by said first floating electrode and said drain pads; and
said second ion-implanted resistance is sandwiched by said first and second floating electrodes.

* * * * *